United States Patent
Ting et al.

(10) Patent No.: US 10,163,689 B2
(45) Date of Patent: Dec. 25, 2018

(54) INTEGRATED CIRCUIT WITH CONDUCTIVE LINE HAVING LINE-ENDS

(71) Applicant: Taiwan Semiconductor Manufacturing Company, Ltd., Hsin-Chu (TW)

(72) Inventors: Chih-Yuan Ting, Taipei (TW); Jyu-Horng Shieh, Hsin-Chu (TW); Pei-Wen Huang, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/384,076

(22) Filed: Dec. 19, 2016

(65) Prior Publication Data

US 2017/0098574 A1  Apr. 6, 2017

Related U.S. Application Data

(62) Division of application No. 14/104,917, filed on Dec. 12, 2013, now Pat. No. 9,524,902.

(51) Int. Cl.
| | |
|---|---|
| *H01L 21/768* | (2006.01) |
| *H01L 21/8234* | (2006.01) |
| *H01L 21/8238* | (2006.01) |
| *H01L 21/033* | (2006.01) |
| *H01L 23/528* | (2006.01) |
| *H01L 23/485* | (2006.01) |
| *H01L 23/532* | (2006.01) |

(52) U.S. Cl.
CPC .... *H01L 21/76816* (2013.01); *H01L 21/0332* (2013.01); *H01L 21/76895* (2013.01); *H01L 21/823475* (2013.01); *H01L 21/823871* (2013.01); *H01L 23/5283* (2013.01); *H01L 23/485* (2013.01); *H01L 23/53233* (2013.01); *H01L 23/53238* (2013.01); *H01L 2924/0002* (2013.01)

(58) Field of Classification Search
CPC ......... H01L 21/76816; H01L 21/76814; H01L 21/76879; H01L 21/823475; H01L 21/823871; H01L 23/5283; H01L 23/485; H01L 23/53233; H01L 23/53238; H01L 2924/0002
See application file for complete search history.

(56) References Cited

U.S. PATENT DOCUMENTS

| | | |
|---|---|---|
| 2010/0283155 A1 | 11/2010 | Tang |
| 2011/0187004 A1 | 8/2011 | Park |
| 2013/0270709 A1 | 10/2013 | Tseng |
| 2014/0191322 A1 | 7/2014 | Botula |

*Primary Examiner* — Peter Bradford
(74) *Attorney, Agent, or Firm* — Haynes and Boone, LLP

(57) ABSTRACT

A semiconductor device is disclosed, including a plurality of conductive features disposed over a substrate. A dielectric layer separates the conductive features. A conductive line is provided, connecting a subset of the conductive features. The conductive line includes a line-like portion and a line-end portion.

20 Claims, 16 Drawing Sheets

INTEGRATED CIRCUIT WITH CONDUCTIVE LINE HAVING LINE-ENDS

The present application is a divisional application of U.S. application Ser. No. 14/104,917, filed Dec. 12, 2013 entitled "Method of Forming Integrated Circuit with Conductive Line having Line-Ends," which is herein incorporated by reference in its entirety.

BACKGROUND

The semiconductor integrated circuit (IC) industry has experienced rapid growth. Technological advances in IC design and materials have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
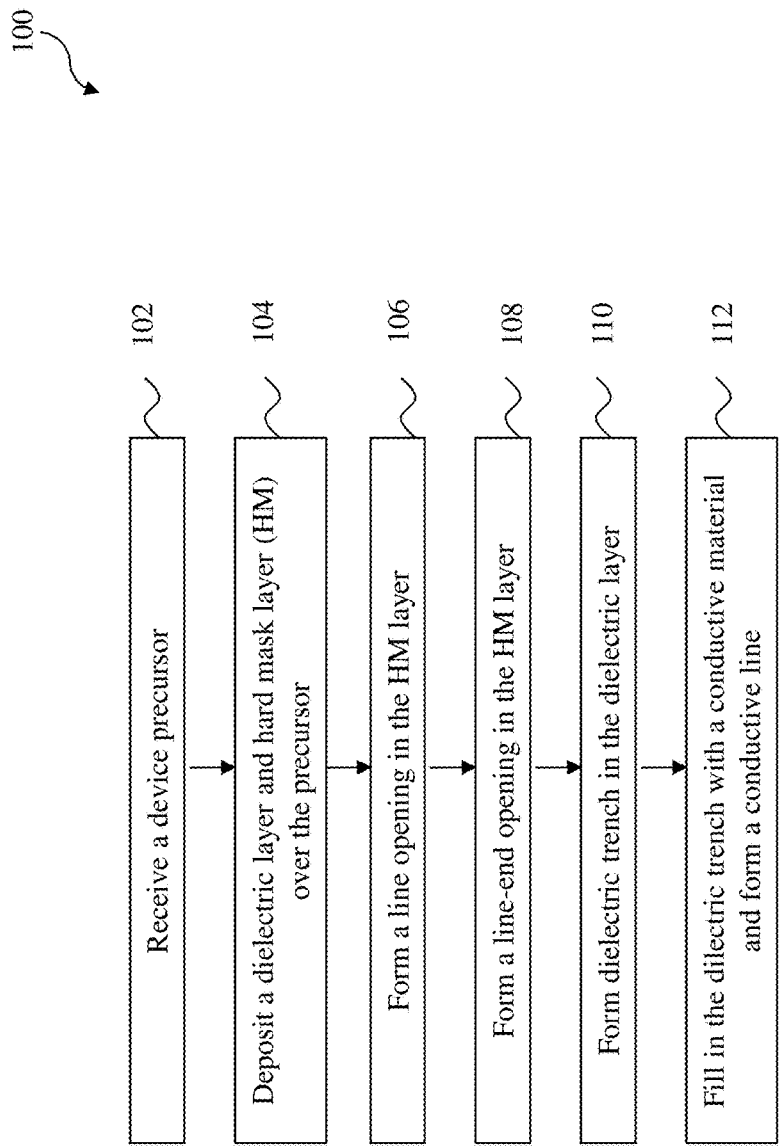
FIG. 1 is a flowchart of an example method for fabricating a semiconductor integrated circuit (IC) constructed according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a flowchart of one embodiment of a method 100 of fabricating one or more semiconductor devices according to aspects of the present disclosure. The method 100 is discussed in detail below, with reference to a semiconductor device 300 shown in FIGS. 2, 3, 4A-4B, 5A-5C, 6 and 7A-7B for the sake of example. It is understood that additional steps can be provided before, during, and after the method, and some of the steps described can be replaced or eliminated for other embodiments of the method.

Figure 2:
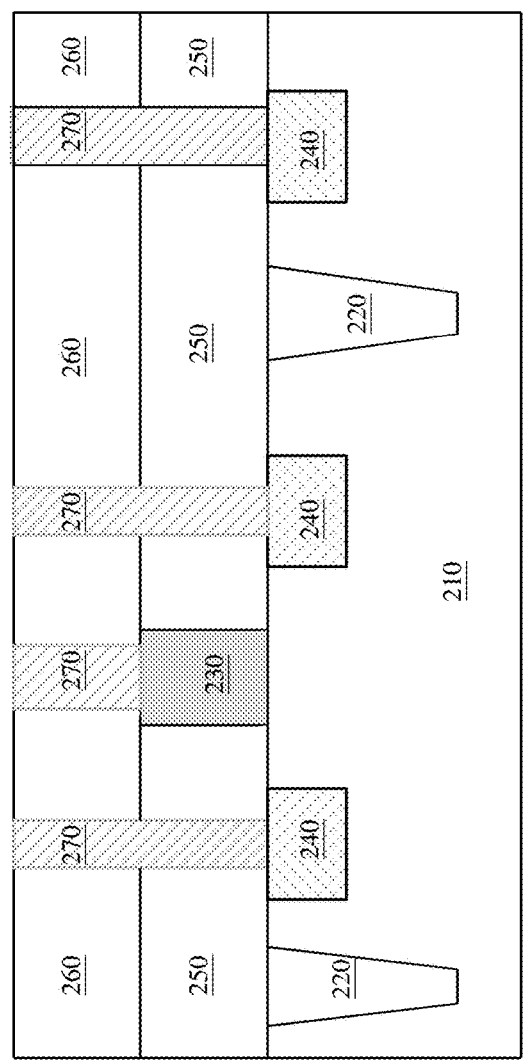
FIG. 2 is a cross-sectional view of an example semiconductor device precursor according to the method of FIG. 1.

Referring to FIGS. 1 and 2, the method 100 begins at step 102 by receiving a semiconductor device precursor 200. The semiconductor device precursor 200 includes a substrate 210. In the present embodiment, the substrate 210 includes silicon. In alternative embodiments, the substrate may include germanium, silicon germanium, gallium arsenide or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The semiconductor device precursor 200 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The semiconductor device precursor 200 also includes one or more first conductive features 230. In one embodiment, the first conductive feature 230 may include high-k/metal gates (HK/MGs), a three-dimension HK/MGs wrapping over a fin-like structure. As an example, the HK/MGs may include a gate dielectric layer and metal gate (MG). The gate dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), or other suitable materials. The MG may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials. Additionally, sidewall spacers (not shown) are formed on the sidewalls of the HK/MGs.

In another embodiment, the first conductive features 230 include electrodes, capacitors, resistors or a portion of a resistor. In yet another embodiment, the first conductive features 230 include a portion of the interconnect structure. For example, the first conductive features 230 include contacts, metal vias, or metal lines.

The semiconductor device precursor 200 also includes second conductive features 240 in the substrate 210. A top surface to the second conductive feature 250 may not be at a same horizontal level as a top surface of the first conductive feature 230. In one embodiment, the second conductive features 240 include doped regions (such as sources or drains). In another embodiment, the second conductive features 240 include electrodes, capacitors, resistors or a portion of a resistor, or a portion of the interconnect structure.

The semiconductor device precursor 200 also includes a first dielectric layer 250 deposited over the substrate 210, including between/over each of the first conductive features 230 and over the second conductive features 240. The first dielectric layer 250 includes silicon oxide, silicon nitride, oxynitride, a dielectric material having a dielectric constant (k) lower than thermal silicon oxide (therefore referred to as low-k dielectric material layer), or other suitable dielectric material layer. The first dielectric layer 250 includes a single layer or multiple layers. A CMP may be performed to remove excessive the first dielectric layer 250 to expose the top surface of the first conductive features 230, as well as to provide a substantially planar top surface for the first conductive features 230 and the first dielectric layer 250.

The semiconductor device precursor 200 also includes a second dielectric layer 260 over the first conductive features 230 and the first dielectric layer 250. The second dielectric layer 410 is similar in many respects to the first dielectric layer 250 discussed above.

The semiconductor device precursor 200 also includes conductive plugs 270 in the first and second dielectric layers, 250 and 260, to form full contacts extending down to the first and the second conductive features, 230 and 240. The conductive plugs 270 are formed along a first direction. The conductive plugs 270 may include copper (Cu), aluminum (Al), tungsten (W), copper or copper alloy, such as copper magnesium (CuMn), copper aluminum (CuAl) or copper silicon (CuSi), or other suitable conductive material. In some cases, the conductive plug 270 is referred to as a metal plug.

Figure 3A:
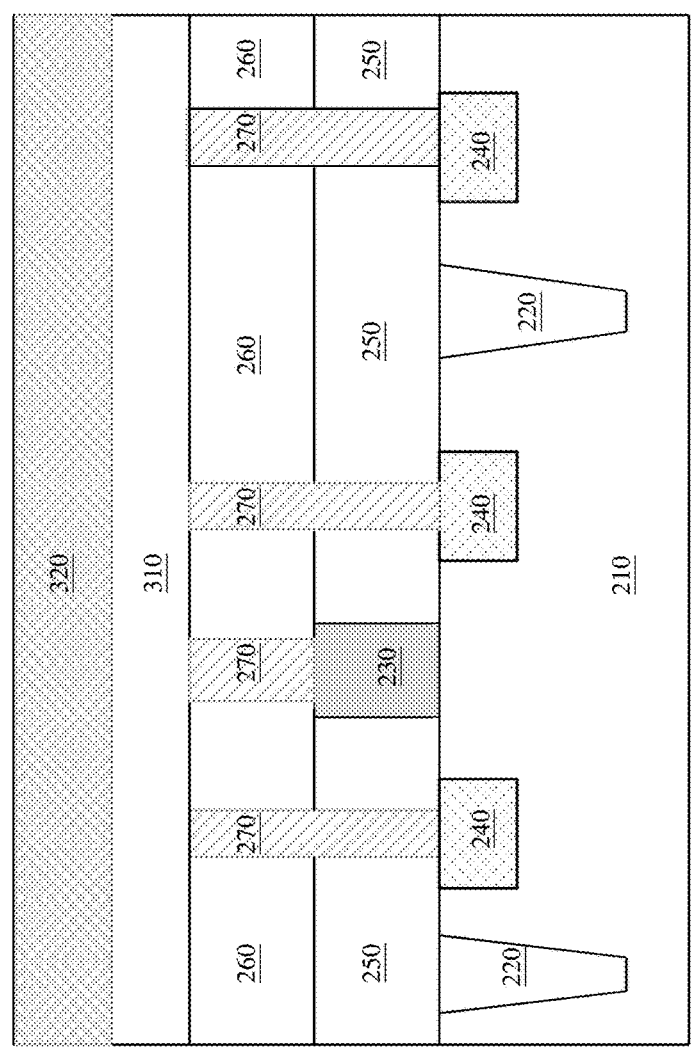
FIGS. 3A and 3B are cross-sectional views of an example semiconductor integrated circuit (IC) at fabrication stages constructed according to the method of FIG. 1.

Referring to FIGS. 1 and 3, once the semiconductor device precursor 200 is received, the method 100 proceeds to step 104 by depositing a third dielectric layer 310 over the second dielectric layer 260, including over the conductive plugs 270, and a hard mask (HM) layer 320 over the third dielectric layer 310. The third dielectric layer 310 is similar in many respects to the first dielectric layer 250 discussed above in association with FIG. 2.

Figure 3B:
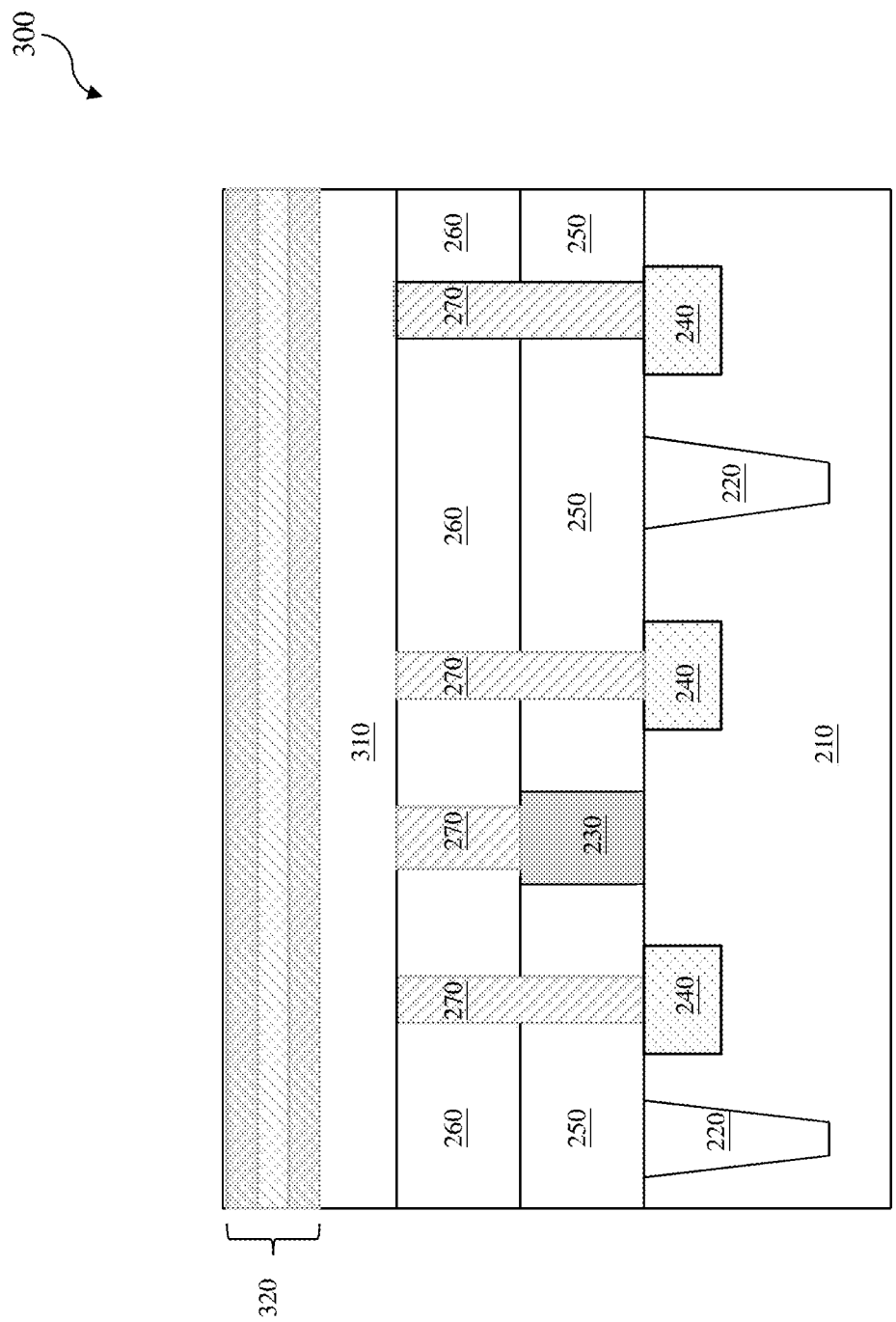

The HM layer 320 includes silicon nitride, silicon oxide, silicon carbide, titanium oxide, titanium nitride, tantalum oxide, tantalum nitride, or any suitable materials. In addition, the HM layer 320 may include a single layer or multiple layers. The HM layer 320 is different from the third dielectric layer 310 to achieve etching selectivity during a subsequent etch, which will be described later. The HM layer 320 may be deposited by suitable techniques, such as CVD, or physical vapor deposition (PVD). In one embodiment, the HM layer 320 includes a stack of layers: a bottom titanium nitride layer deposited over the third dielectric layer 310; an anti-reflection coating (ARC) layer deposited over the bottom titanium nitride layer and a top titanium nitride layer deposited over the ARC layer, as shown in FIG. 3B.

Figures 4A, 4B:
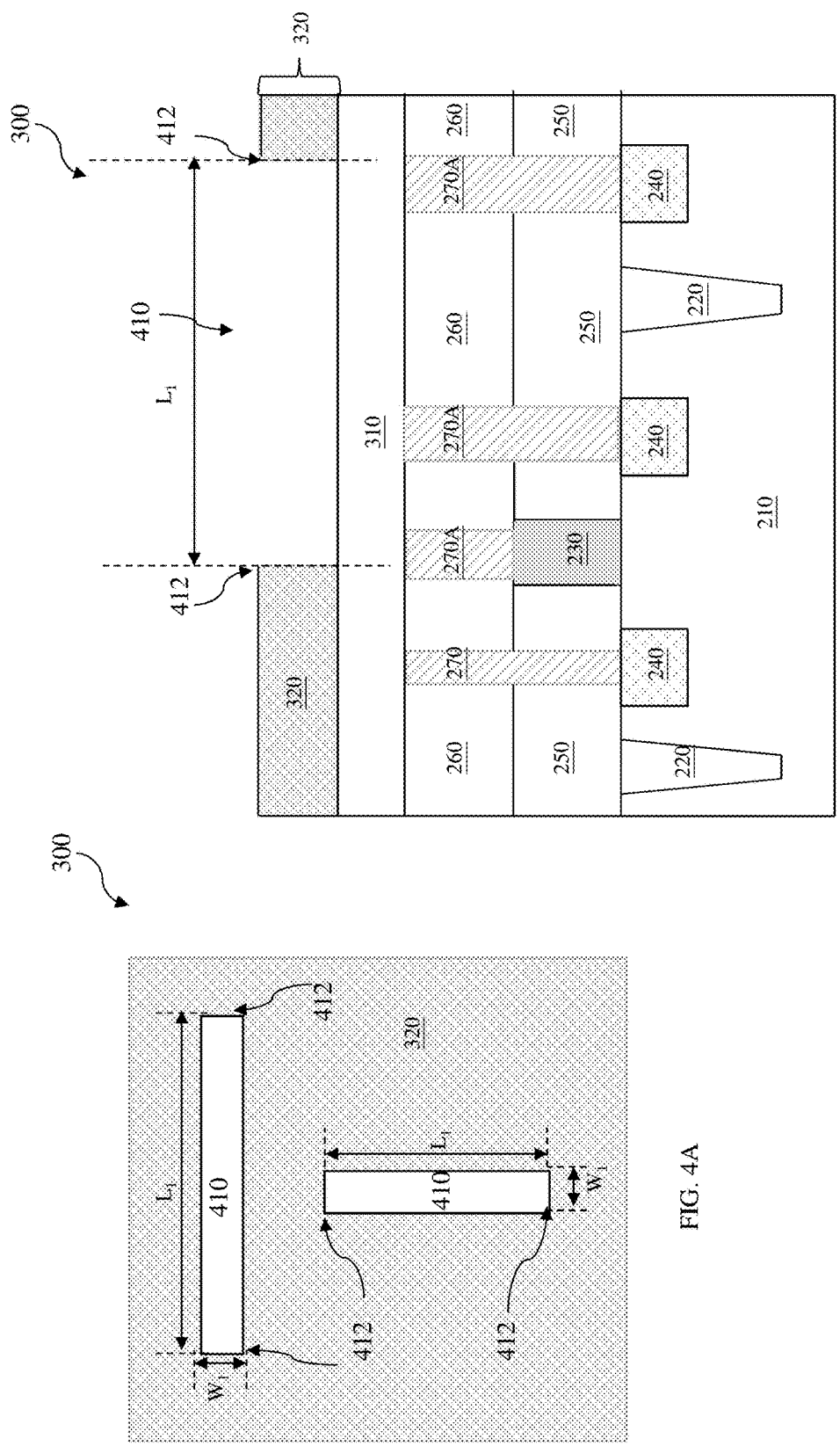
FIG. 4A is a top schematic view of an example semiconductor integrated circuit (IC) at fabrication stages constructed according to the method of FIG. 1.
FIGS. 4B and 4C are cross-sectional views of an example semiconductor integrated circuit (IC) at fabrication stages constructed according to the method of FIG. 1.
Figure 4C:
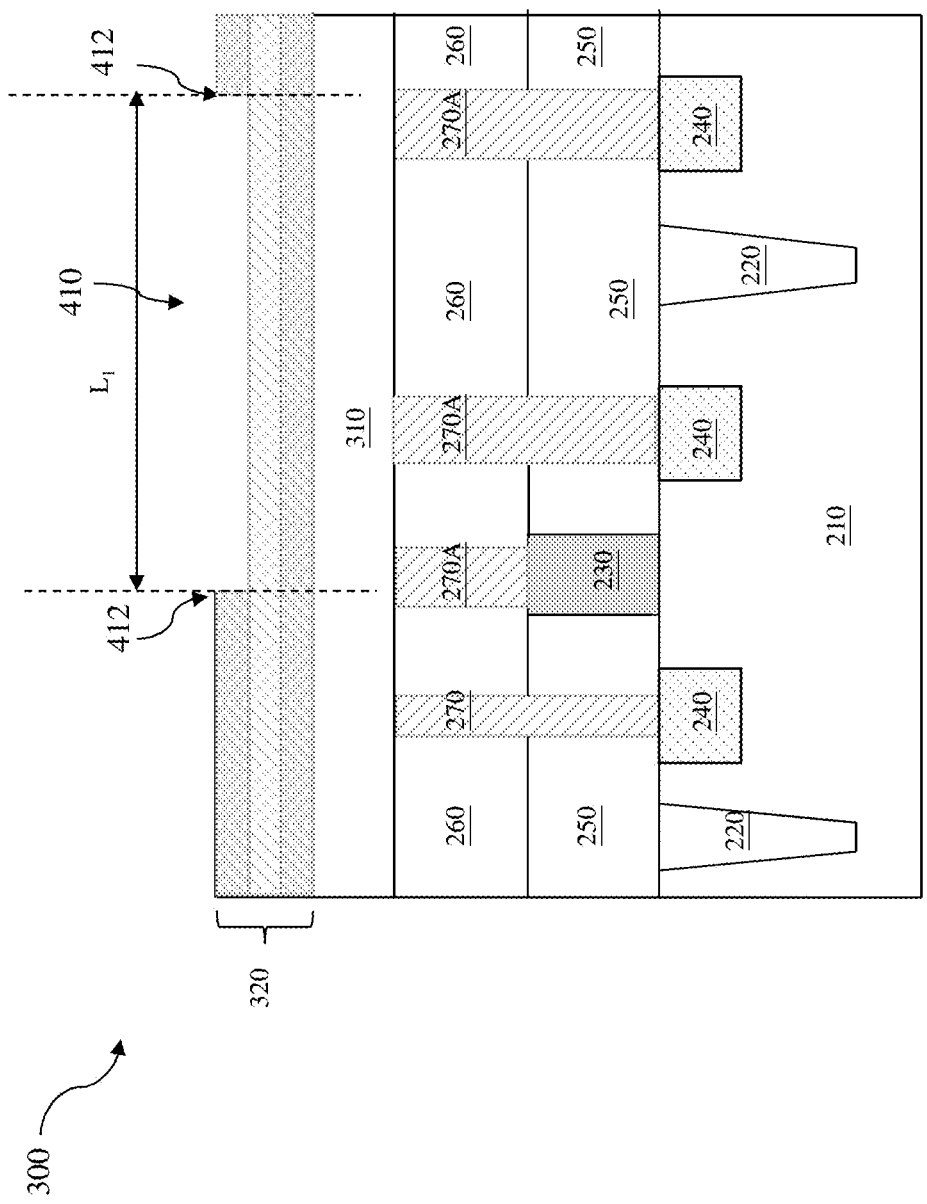
Figure 4D:
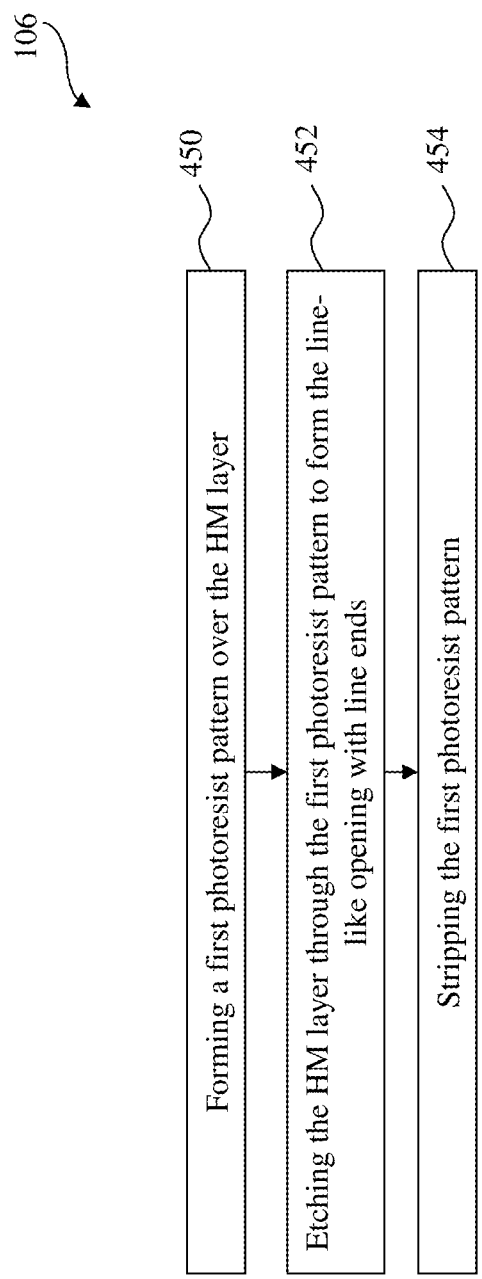
FIGS. 4D and 4E are flowcharts of example methods for fabricating a semiconductor integrated circuit (IC) constructed according to various aspects of the present disclosure.
Figure 4E:
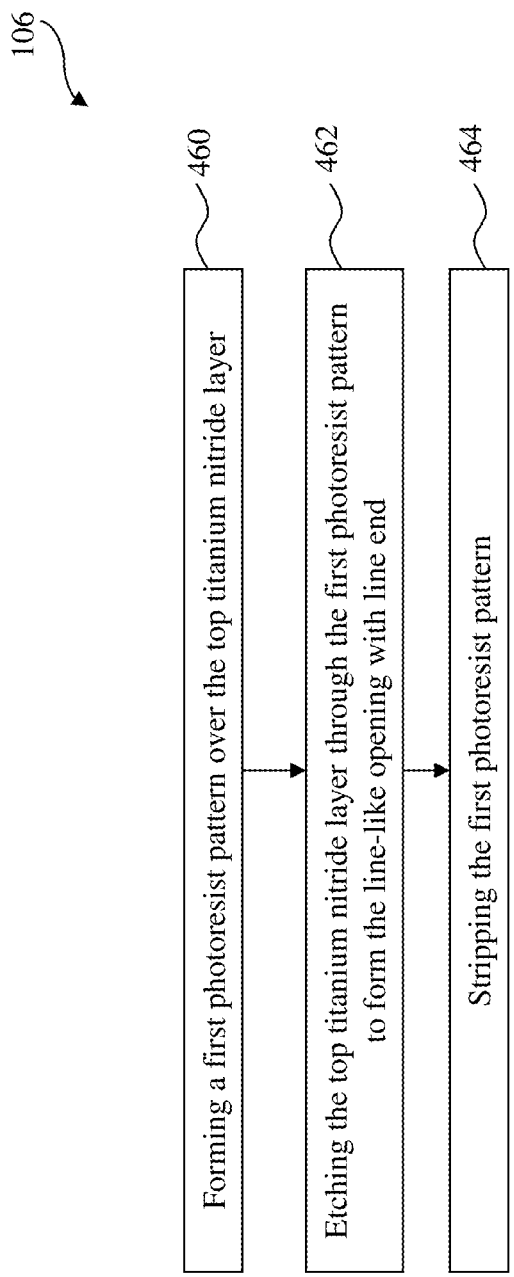

Referring to FIGS. 1 and 4A-4B, the method 100 proceeds to step 106 by forming a first opening 410 on the HM layer 320. The first opening 410 has a first length $L_1$ landing in a plane, which is perpendicular to the first direction, and a first width $W_1$. In the present embodiment, the first length $L_1$ is defined by two line-ends 412 and is substantially larger than the first width $W_1$. Therefore, in some cases, the first opening 410 is referred to as a line-like opening. The first opening 410 is aligned to a subset of the conductive plugs 270, now labeling them with the reference number 270A. The first opening 410 may be formed by a procedure (shown in FIG. 4D) that includes depositing a resist layer (block 450), forming a first resist pattern on the resist layer, and etching the HM layer 320 using the first resist pattern as an etch mask (block 452). The first resist pattern is then removed by wet stripping or plasma ashing (block 454). In one embodiment, the first openings 410 are formed by removing the top titanium nitride layer of the HM stack 320 using the first resist pattern as an etch mask, as shown in FIG. 4C and FIG. 4E (blocks 460, 462, and 464).

Referring to FIGS. 1 and 5A-5C, the method 100 proceeds to step 108 by forming a second opening 510 on the HM layer 320, landing in the same place as (or near to) where the first opening 410 landed. In the present embodiment, the second opening 510 fully contacts, or overlaps with, the first opening 410 at the line-ends 412. Thus, the second opening 510 forms a new line-end 512 for the first opening 410. In other words, with the second opening 510, the line-end 412 is replaced by the new line-ends 512. The second opening 510 has a second length $L_2$ along the same direction as the first length $L_1$ and a second width $W_2$ along the same direction as the first width $W_1$. The second length $L_2$ is substantially smaller than the first length $L_1$. The second width $W_2$ is same or larger than the first width $W_1$. In some cases, the second opening 510 is referred to as a line-end opening.

Figures 5A, 5B:
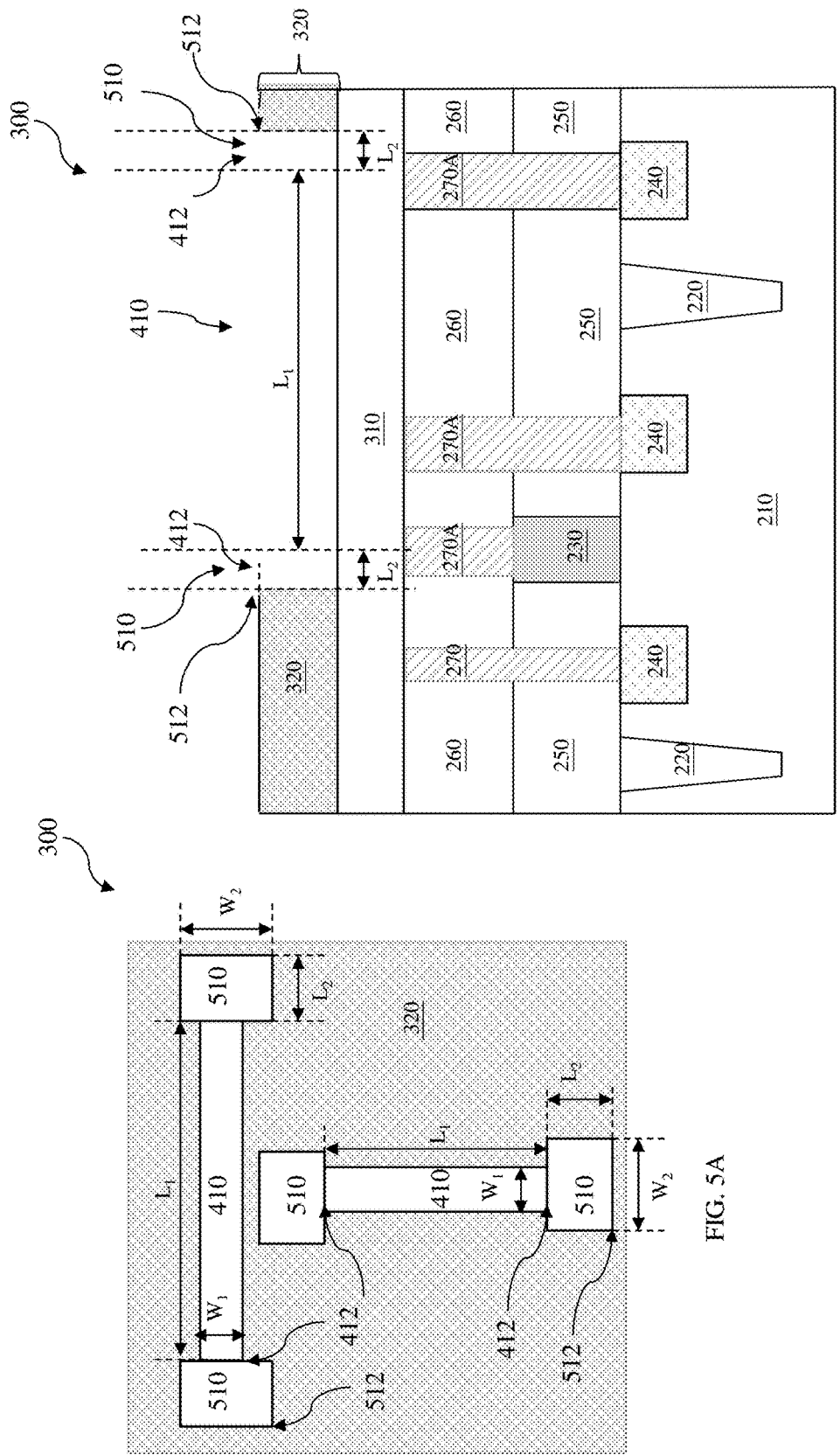
FIGS. 5A and 5C are top schematic views of an example semiconductor integrated circuit (IC) at fabrication stages constructed according to the method of FIG. 1.
FIGS. 5B and 5D are cross-sectional views of an example semiconductor integrated circuit (IC) at fabrication stages constructed according to the method of FIG. 1.
Figure 5C:
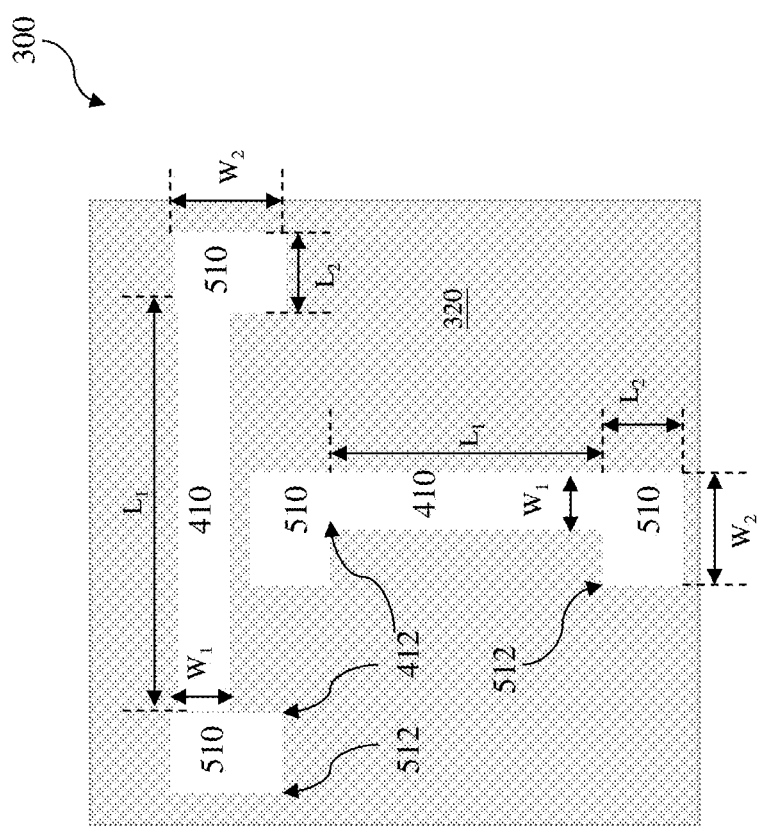

In one embodiment, the second width $W_2$ is larger than the first width $W_1$ and the second opening 510 locates symmetrically to the first opening 410 at the line-end 412 (as shown in FIG. 5A). In another embodiment, the second width $W_2$ is larger than the first width $W_1$ and the second opening 510 locates asymmetrically to the first opening 410 at the line-end 412 (as shown in FIG. 5C). In some embodiments, the second opening 510 has a rectangular shape.

Figure 5D:
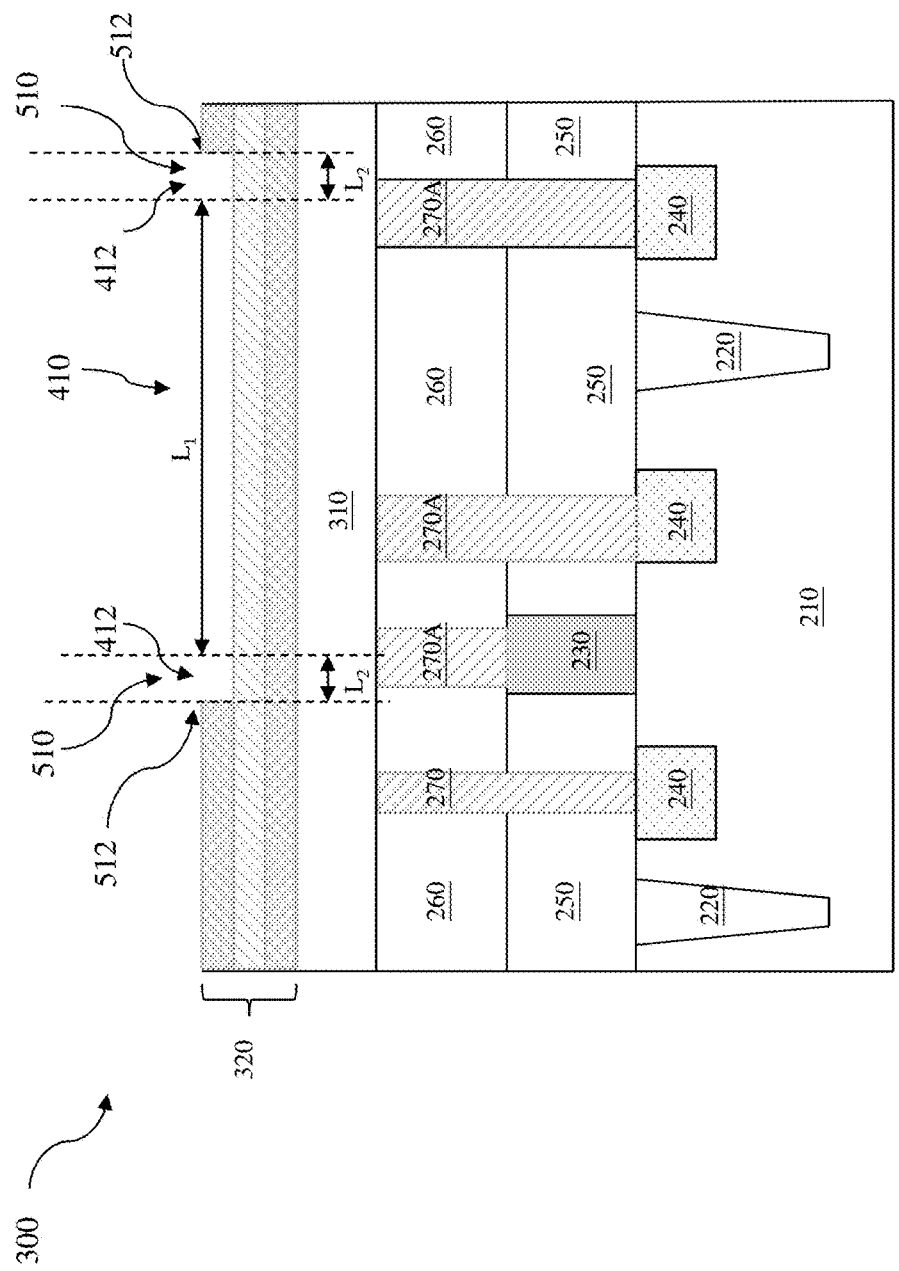
Figure 5E:
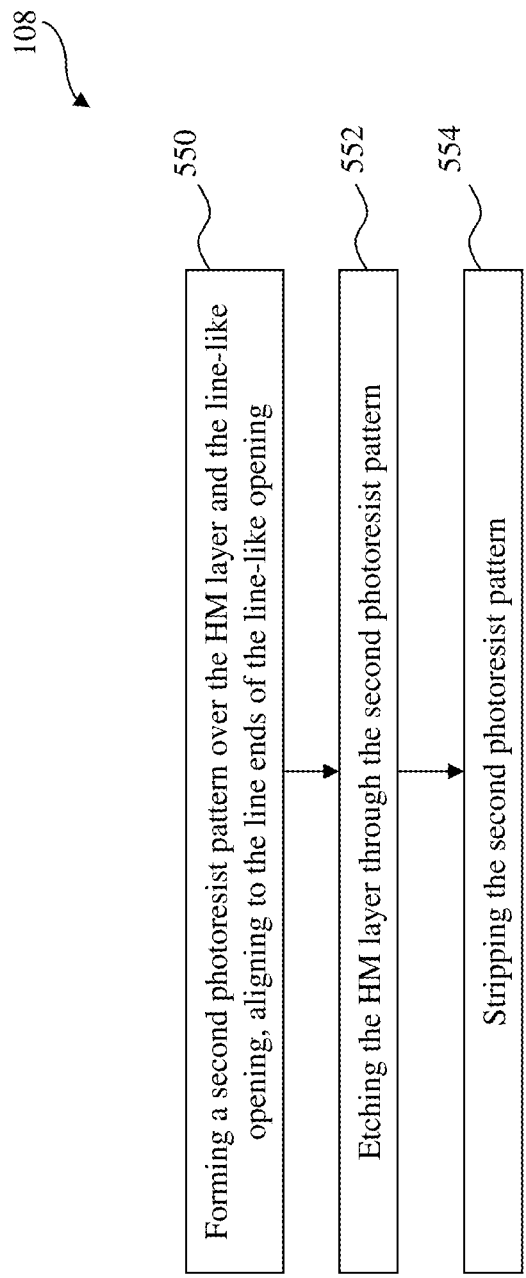
FIGS. 5E and 5F are flowcharts of example methods for fabricating a semiconductor integrated circuit (IC) constructed according to various aspects of the present disclosure.
Figure 5F:
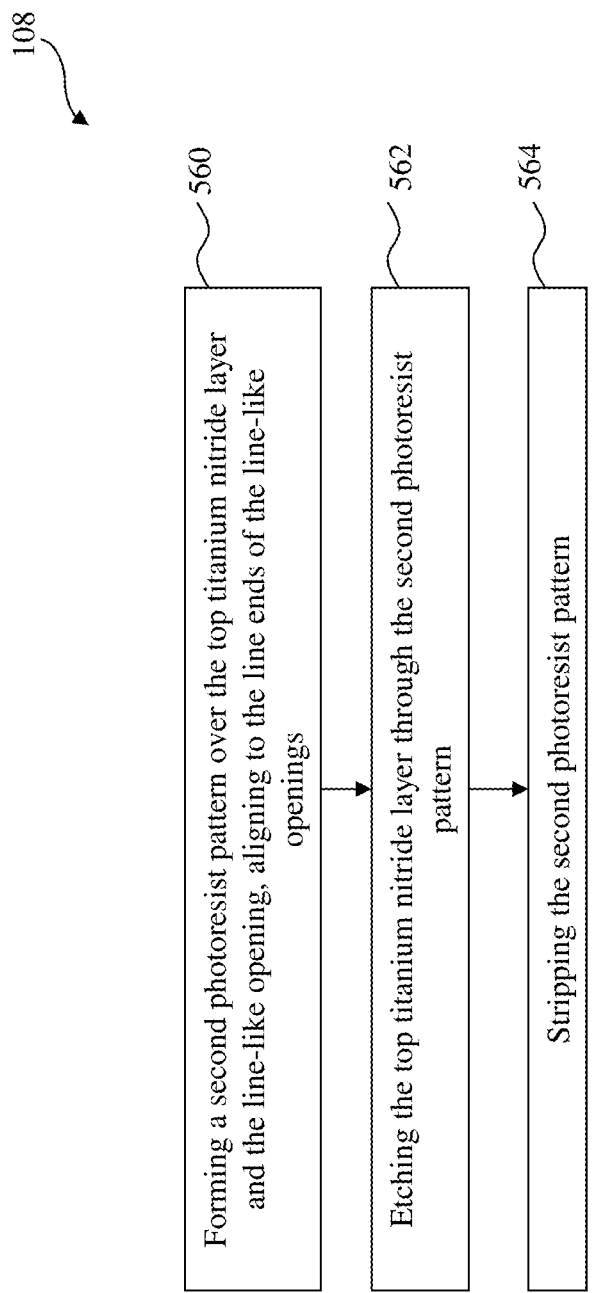

As shown in FIG. 5E, the second openings 510 may be formed similar in many respects to the first opening 410 discussed above in association with FIGS. 4A and 4B, which includes forming a resist layer over the HM layer 320 and the first opening 410, forming a second resist pattern on the resist layer (block 550) and etching the HM layer 320 using the second resist pattern as an etch mask (block 552). The second resist pattern is then removed by wet stripping or plasma ashing (block 554). In one embodiment, the second openings 510 are formed by removing the top titanium nitride layer of the HM stack 320 using the second resist pattern as an etch mask, as shown in FIGS. 5D and 5F (blocks 560, 562, and 564).

Figures 6A, 6B:
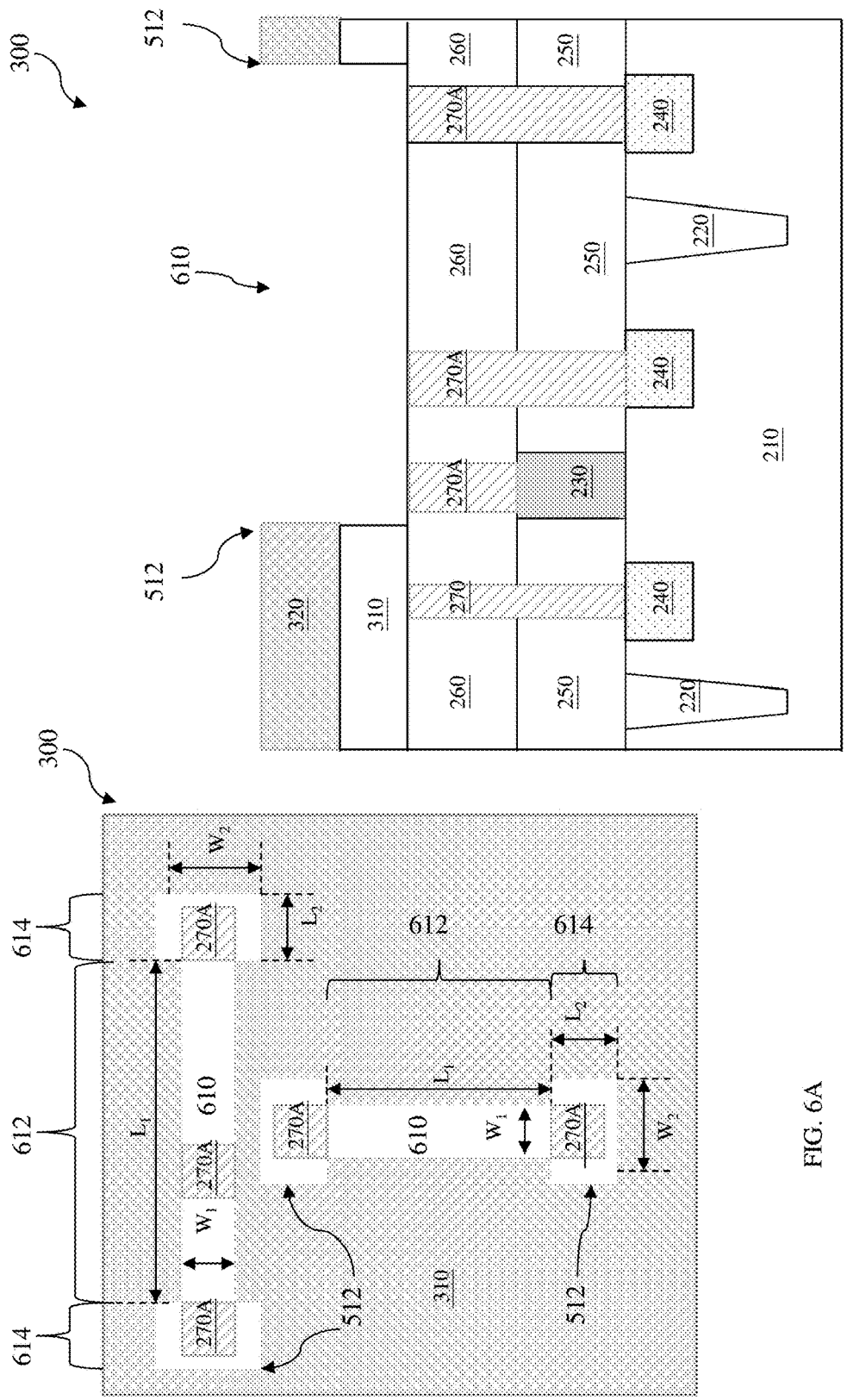
FIGS. 6A and 7A are top schematic views of an example semiconductor integrated circuit (IC) at fabrication stages constructed according to the method of FIG. 1.
FIGS. 6B and 7B are cross-sectional views of an example semiconductor integrated circuit (IC) at fabrication stages constructed according to the method of FIG. 1.
Figure 6C:
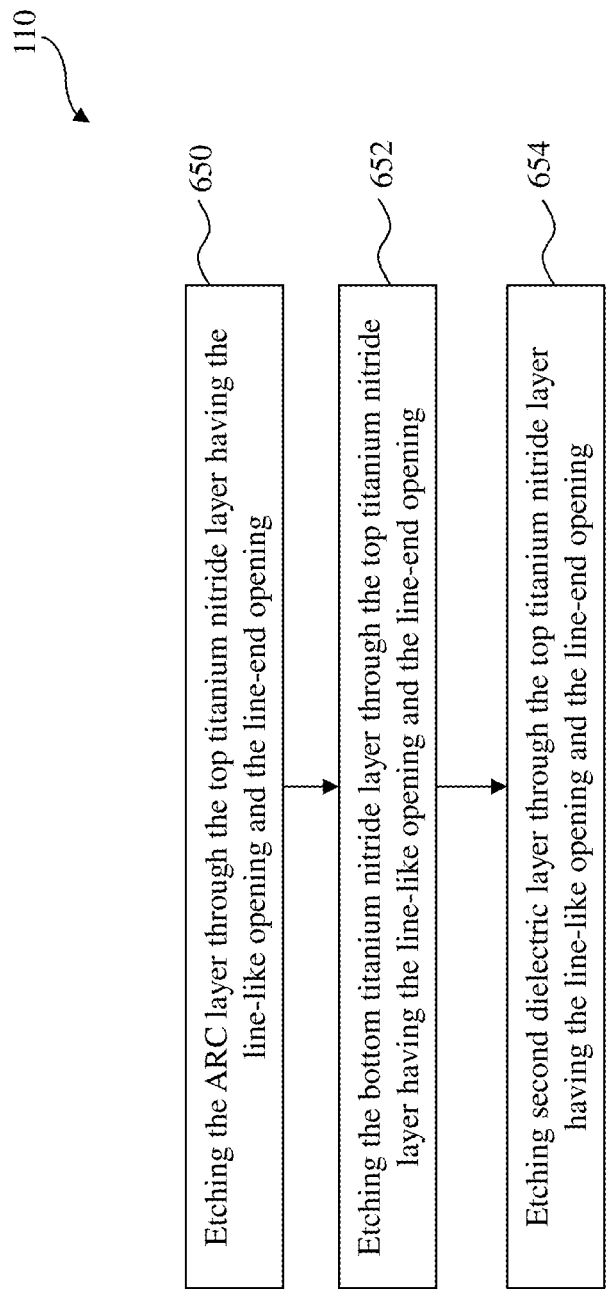
FIG. 6C is a flowchart of an example method for fabricating a semiconductor integrated circuit (IC) constructed according to various aspects of the present disclosure.

Referring to FIGS. 1 and 6A-6B, the method 100 proceeds to step 110 by forming a dielectric trench 610 to expose the conductive plugs 270A. In the present embodiment, the dielectric trench 610 is formed by etching the third dielectric layer 310 using the HM layer 320 with the first and the second openings, 410 and 510, as an etch mask. In one embodiment, the etch process selectively removes the third dielectric layer 310 but substantially does not etch the HM layer 320. Therefore the dielectric trench 610 carries a profile of a combination of the first and the second openings, 410 and 510. In another embodiment (shown in FIG. 6C), using the HM layer 320 with the first and the second openings, 410 and 510, in the top titanium nitride layer of the HM stack 320 as an etch mask, the dielectric trench 610 is formed by etching the ARC layer (block 650), the bottom titanium nitride layer (block 652) and the third dielectric layer 310 (block 654).

The dielectric trench 610 has a line-like portion 612 and a line-end portion 614. The line-end portion 614 has the second width $W_2$, which is equal or larger than the first width $W_1$ of the line portion 612. In one embodiment, the second width $W_2$ is larger than the first width $W_1$ and the line-end portion 614 located symmetrically to the line-like portion 612. In another embodiment, the second width $W_2$ is larger than the first width $W_1$ and the line-end portion 614 locates asymmetrically to the line-like portion 612.

Figures 7A, 7B:
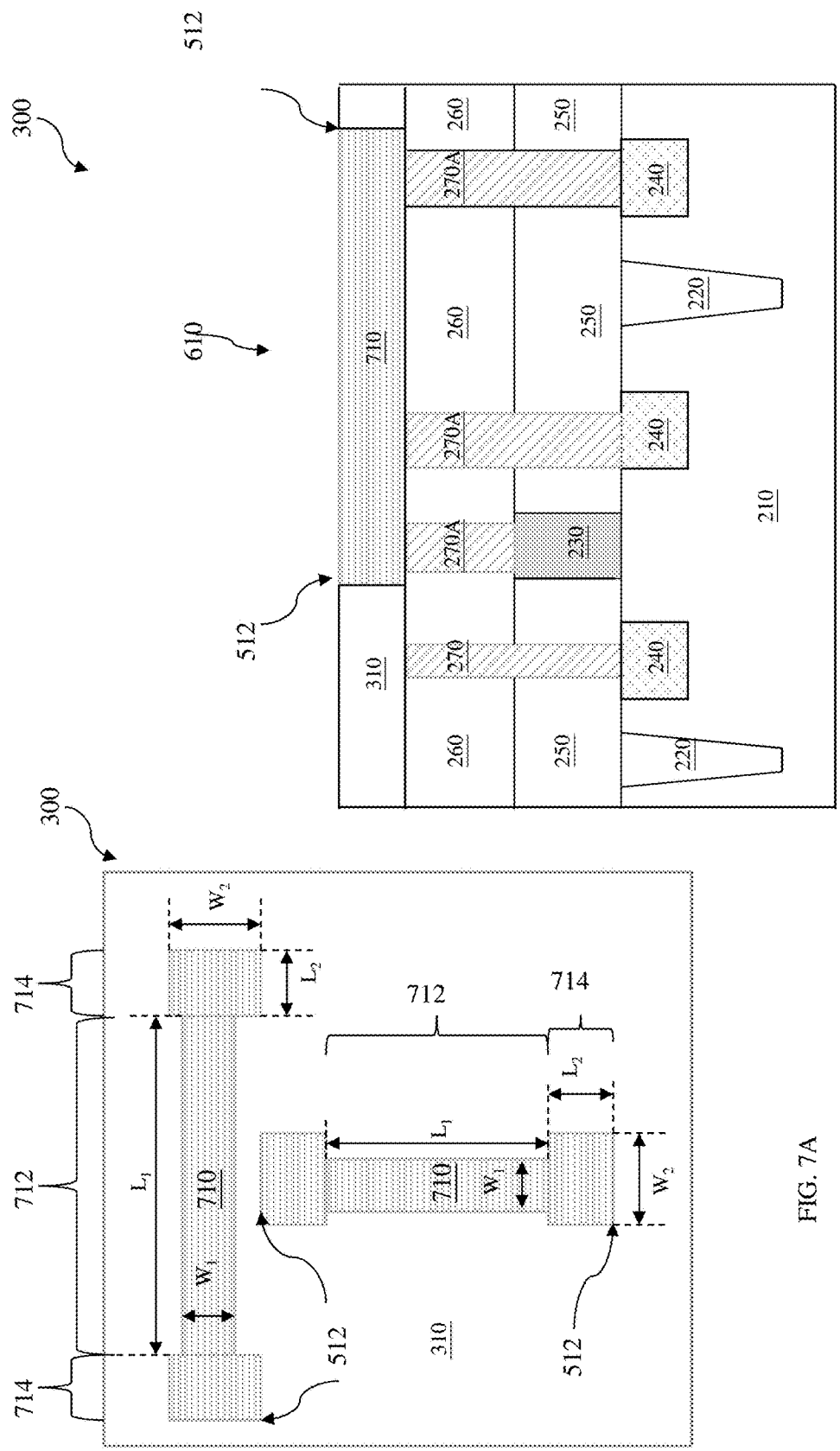

Referring to FIGS. 1 and 7A-7B, the method 100 proceeds to step 112 by filling in the dielectric trench with conductive materials and forming a conductive line 710. In one embodiment, a barrier layer is filled in the dielectric trench 610 first by a proper deposition technique, such as PVD and CVD. The barrier layer may include a metal and is electrically conductive but does not permit (or reduces) inter-diffusion and reactions between the third dielectric material layer 310 and the conductive material to be filled in the dielectric trench 610. The barrier layer may include refractory metals and their nitrides. In various examples, the barrier layer includes TiN, TaN, Co, WN, TiSiN, TaSiN, or combinations thereof. The barrier layer may include multiple films.

The conductive material 710 then fills in the dielectric trench 610, as well as over the barrier layer. The conductive material 710 may include copper (Cu), aluminum (Al), tungsten (W), copper or copper alloy, such as copper magnesium (CuMn), copper aluminum (CuAl) or copper silicon (CuSi), or other suitable conductive material. The conductive material 710 may be deposited by y PVD, CVD, metal-organic chemical vapor deposition (MOCVD), or plating. A recess is then performed to etch back the excessive conductive material 710, as well as the excessive barrier layer, to form the conductive line 710 and a substantial planar surface with the third dielectric layer 310. For example, the recess is performed by chemical mechanical polishing (CMP).

Referring again to FIG. 7A, in the present embodiment, the conductive line 710 carries the profile of the dielectric trench 610 and has a line portion 712 and a line-end portion 714. The line-end portion 714 has the second width $W_2$, which is equal or larger than the first width $W_1$ of the line portion 712. In one embodiment, the second width $W_2$ is larger than the first width $W_1$ and the line-end portion 714 located symmetrically to the line portion 712. In another embodiment, the second width $W_2$ is larger than the first width $W_1$ and the line-end portion 714 locates asymmetrically to the line portion 712.

Additional steps can be provided before, during, and after the method 100, and some of the steps described can be replaced, eliminated, or moved around for additional embodiments of the method 100. The device 300 may undergo further CMOS or MOS technology processing to form various features and regions.

Based on the above, the present disclosure offers a semiconductor device. The semiconductor device may include a plurality of conductive features over a substrate, a dielectric layer separating the conductive features, and a conductive line connecting a subset of the conductive features. The conductive line may include a line-like portion having a first length and a first width and a line-end portion connecting to an end of the line-like portion, wherein the line-end portion has a second width, equal to or larger than the first width, wherein the line-end portion has a second length, smaller than the first length.

In some embodiments, the line-end portion of the conductive line stays symmetrically to the line-like portion. The line-end portion of the conductive line, having a larger width than the width of the line-like portion, may stay asymmetrically to the line-like portion. The line-end portion may have a rectangular shape. The plurality of conductive features may extend through the dielectric layer. The semiconductor device may include a hard mask (HM) layer disposed over the dielectric layer, wherein the conductive line is formed within the dielectric layer and the HM layer.

In other embodiment, a semiconductor device is provided, which may include a substrate, a first set of conductive features formed over the substrate, a second set of conductive features formed over the substrate, a first dielectric layer separating the first set of conductive features and the second set of conductive features, a second dielectric layer formed over the first dielectric layer, and a hard mask (HM) layer formed over the second dielectric layer, wherein the HM layer and the second dielectric layer comprise a line-end opening and a line-like opening, wherein the line-end opening is aligned to the first set of conductive features, wherein the line-end opening connects with the line-like opening at a first end of the line-like opening, wherein the line-like opening has a first width and the line-end opening has a second width greater than the first width.

In some embodiments, a conductive line is provided connecting the first set of conductive features and the second set of conductive features. The conductive line may be disposed in a trench within the second dielectric layer. The line-like opening may be aligned to the second set of conductive features. The line-end opening may have a rectangular shape. A second line-end opening may be provided, connected with the line-like opening at a second end of the line-like opening. In some embodiments, the HM layer includes a stack of layers, including a bottom titanium nitride layer, an anti-reflection coating (ARC) layer formed over the bottom titanium nitride layer, and a top titanium nitride layer formed over the ARC layer.

In another embodiment, a semiconductor device is provided, including a substrate, a first dielectric layer formed over the substrate, a second dielectric layer formed over the first dielectric layer, a set of conductive features extending through the first and second dielectric layers, a third dielectric layer formed over the second dielectric layer, and a hard mask (HM) layer formed over the third dielectric layer, wherein a trench is formed within the third dielectric layer and the HM layer, the trench comprising a line-like opening and two line-end openings connecting with the line-like opening at respective ends of the line-like opening, wherein the two line-end openings are aligned to a first subset of the set of conductive features, wherein the line-like opening has a first width and the two line-end openings each have a second width greater than the first width.

In some embodiments, the trench is filled with conductive material to form a conductive line. The conductive line may connect at least two conductive features within the set of conductive features. The line-like opening may be aligned to a second subset of the set of conductive features. A length and a width of each line-end opening may be the same. The line-like opening may have a first length and the line-end openings each may have a second length smaller than the first length. In some embodiments, the HM layer includes a stack of layers, including a bottom titanium nitride layer, an anti-reflection coating (ARC) layer formed over the bottom titanium nitride layer, and a top titanium nitride layer formed over the ARC layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a plurality of conductive features over a substrate;
    a dielectric layer separating the conductive features; and
    a conductive line connecting a subset of the conductive features, the conductive line including:
        a line-like portion having a first length and a first width; and
        a line-end portion connecting to an end of the line-like portion and disposed over one or more conductive features of the subset of the conductive features, wherein the line-end portion has a second width, larger than the first width, wherein the line-end portion has a second length, smaller than the first length.

2. The device of claim 1, wherein the line-end portion of the conductive line is centered with respect to the end of the line-like portion.

3. The device of claim 1, wherein the line-end portion of the conductive line, having a larger width than the first width of the line-like portion, is not centered with respect to the end of the line-like portion.

4. The device of claim 1, wherein the line-end portion has a rectangular shape.

5. The device of claim 1, wherein the plurality of conductive features extends through the dielectric layer.

6. The device of claim 1, further comprising a hard mask (HM) layer disposed over the dielectric layer, wherein the conductive line is formed within the dielectric layer and the HM layer.

7. A semiconductor device comprising:
    a substrate;
    a first set of conductive features formed over the substrate;
    a second set of conductive features formed over the substrate;
    a first dielectric layer separating the first set of conductive features and the second set of conductive features;
    a second dielectric layer formed over the first dielectric layer; and
    a hard mask (HM) layer formed over the second dielectric layer, wherein the HM layer and the second dielectric layer comprise a line-end opening and a line-like opening, wherein the line-end opening is aligned to the first set of conductive features, wherein the line-end opening exposes the first set of conductive features, wherein the line-end opening connects with the line-like opening at a first end of the line-like opening, wherein the line-like opening has a first width and the line-end opening has a second width greater than the first width, wherein the line-like opening has a first length and the line-end opening has a second length smaller than the first length.

8. The device of claim 7, further comprising a conductive line connecting the first set of conductive features and the second set of conductive features.

9. The device of claim 8, wherein the conductive line is disposed in a trench within the second dielectric layer.

10. The device of claim 7, wherein the line-like opening is aligned to the second set of conductive features.

11. The device of claim 7, wherein the line-end opening has a rectangular shape.

12. The device of claim 7, comprising a second line-end opening connected with the line-like opening at a second end of the line-like opening.

13. The device of claim 7, wherein the HM layer includes a stack of layers, comprising:
- a bottom titanium nitride layer;
- an anti-reflection coating (ARC) layer formed over the bottom titanium nitride layer; and
- a top titanium nitride layer formed over the ARC layer.

14. A semiconductor device comprising:
- a substrate;
- a first dielectric layer formed over the substrate;
- a second dielectric layer formed over the first dielectric layer;
- a set of conductive features extending through the first and second dielectric layers;
- a third dielectric layer formed over the second dielectric layer; and
- a hard mask (HM) layer formed over the third dielectric layer, wherein a trench is formed within the third dielectric layer and the HM layer, the trench comprising a line-like opening and two line-end openings connecting with the line-like opening at respective ends of the line-like opening, wherein the two line-end openings are aligned to a first subset of the set of conductive features, wherein the two line-end openings expose the first subset of the set of conductive features, wherein the line-like opening has a first width and the two line-end openings each have a second width greater than the first width, wherein the line-like opening has a first length and the two line-end openings each have a second length smaller than the first length.

15. The device of claim 14, wherein the trench is filled with conductive material to form a conductive line.

16. The device of claim 15, wherein the conductive line connects at least two conductive features within the set of conductive features.

17. The device of claim 14, wherein the line-like opening is aligned to a second subset of the set of conductive features.

18. The device of claim 14, wherein a length and a width of each line-end opening is the same.

19. The device of claim 14, wherein the respective ends of the line-like opening abut respective sides of each of the line-end openings.

20. The device of claim 14, wherein the HM layer includes a stack of layers, comprising:
- a bottom titanium nitride layer;
- an anti-reflection coating (ARC) layer formed over the bottom titanium nitride layer; and
- a top titanium nitride layer formed over the ARC layer.

* * * * *